(12) United States Patent
Wehrly, Jr.

(10) Patent No.: US 7,605,454 B2
(45) Date of Patent: *Oct. 20, 2009

(54) MEMORY CARD AND METHOD FOR DEVISING

(75) Inventor: James Douglas Wehrly, Jr., Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/670,396

(22) Filed: Feb. 1, 2007

(65) Prior Publication Data

US 2007/0158795 A1 Jul. 12, 2007

Related U.S. Application Data

(63) Continuation of application No. 11/434,964, filed on May 16, 2006, which is a continuation-in-part of application No. 11/330,307, filed on Jan. 11, 2006, now Pat. No. 7,508,058.

(51) Int. Cl.
*H01L 23/02* (2006.01)
*H01L 21/48* (2006.01)
*H01L 23/04* (2006.01)
*H01L 23/34* (2006.01)
*H01L 23/52* (2006.01)
*H01L 29/40* (2006.01)

(52) U.S. Cl. .............................. 257/679; 257/E23.065; 257/E23.176; 257/E23.177; 257/E27.137; 257/E27.144; 257/E27.161; 257/686; 257/685; 257/688; 257/692; 257/723; 257/730; 257/777; 257/778; 438/121; 361/749

(58) Field of Classification Search ................. 257/686, 257/685, 692, 723, 730, 777, 778, E27.137, 257/E27.144, E27.161, 679, E23.065, E23.176, 257/E23.177, E25.023; 438/121; 361/749
See application file for complete search history.

(56) References Cited

U.S. PATENT DOCUMENTS

| 3,436,604 A | 4/1969 | Hyltin |
| 3,654,394 A | 4/1972 | Gordon |
| 3,704,455 A | 11/1972 | Scarbrough |
| 3,746,934 A | 7/1973 | Stein |
| 3,766,439 A | 10/1973 | Isaacson |
| 3,772,776 A | 11/1973 | Weisenburger |
| 3,983,547 A | 9/1976 | Almasi |
| 4,288,841 A | 9/1981 | Gogal |
| 4,398,235 A | 8/1983 | Lutz et al. |
| 4,406,508 A | 9/1983 | Sadigh-Behzadi |

(Continued)

OTHER PUBLICATIONS

PCT/US07/65006 International Search Report, PCT, Feb. 29, 2008.

*Primary Examiner*—Alexander O Williams
(74) *Attorney, Agent, or Firm*—Fish & Richardson P.C.

(57) ABSTRACT

The present invention provides a system and method for employing leaded packaged memory devices in memory cards. Leaded packaged ICs are disposed on one or both sides of a flex circuitry structure to create an IC-populated structure. In a preferred embodiment, leads of constituent leaded IC packages are configured to allowed the lower surface of the leaded IC packages to contact respective surfaces of the flex circuitry structure. Contacts for typical embodiments are supported by a rigid portion of the flex circuitry structure and the IC-populated structure is disposed in a casing to provide card structure for the module.

18 Claims, 16 Drawing Sheets

U.S. PATENT DOCUMENTS

| | | | |
|---|---|---|---|
| 4,437,235 A | 3/1984 | McIver |
| 4,466,183 A | 8/1984 | Burns |
| 4,513,368 A | 4/1985 | Houseman |
| 4,567,543 A | 1/1986 | Miniet |
| 4,587,596 A | 5/1986 | Bunnell |
| 4,645,944 A | 2/1987 | Uya |
| 4,656,605 A | 4/1987 | Clayton |
| 4,682,207 A | 7/1987 | Akasaki et al. |
| 4,696,525 A | 9/1987 | Coller et al. |
| 4,709,300 A | 11/1987 | Landis |
| 4,733,461 A | 3/1988 | Nakano |
| 4,758,875 A | 7/1988 | Fujisawa et al. |
| 4,763,188 A | 8/1988 | Johnson |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,884,237 A | 11/1989 | Mueller et al. |
| 4,891,789 A | 1/1990 | Quattrini et al. |
| 4,894,706 A | 1/1990 | Sato et al. |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,850 A * | 2/1991 | Corbett et al. .............. 257/203 |
| 5,012,323 A | 4/1991 | Farnworth |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,050,039 A | 9/1991 | Edfors |
| 5,053,853 A | 10/1991 | Haj-Ali-Ahmadi et al. |
| 5,065,277 A | 11/1991 | Davidson |
| 5,081,067 A | 1/1992 | Shimru et al. |
| 5,099,393 A | 3/1992 | Bentlage et al. |
| 5,104,820 A | 4/1992 | Go, deceased et al. |
| 5,117,282 A | 5/1992 | Salatino |
| 5,122,862 A | 6/1992 | Kajihara et al. |
| 5,138,430 A | 8/1992 | Gow et al. |
| 5,140,405 A | 8/1992 | King et al. |
| 5,159,434 A | 10/1992 | Kohno et al. |
| 5,159,535 A | 10/1992 | Desai et al. |
| 5,191,404 A | 3/1993 | Wu et al. |
| 5,198,888 A | 3/1993 | Sugano et al. |
| 5,198,965 A | 3/1993 | Curtis et al. |
| 5,208,729 A | 5/1993 | Cipolla et al. |
| 5,219,794 A | 6/1993 | Satoh et al. |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewiez et al. |
| 5,243,133 A | 9/1993 | Engle et al. |
| 5,247,423 A | 9/1993 | Lin et al. |
| 5,252,857 A | 10/1993 | Kane et al. |
| 5,253,010 A | 10/1993 | Oku et al. |
| 5,259,770 A | 11/1993 | Bates et al. |
| 5,261,068 A | 11/1993 | Gaskins et al. |
| 5,262,927 A | 11/1993 | Chia et al. |
| 5,268,815 A | 12/1993 | Cipolla et al. |
| 5,276,418 A | 1/1994 | Klosowiak et al. |
| 5,279,029 A | 1/1994 | Burns |
| 5,281,852 A | 1/1994 | Normington |
| 5,289,062 A | 2/1994 | Wyland |
| 5,289,346 A | 2/1994 | Carey et al. |
| 5,311,401 A | 5/1994 | Gates et al. |
| 5,313,096 A | 5/1994 | Eide |
| 5,313,097 A | 5/1994 | Haj-Ali-Ahmadi et al. |
| 5,343,075 A | 8/1994 | Nishino |
| 5,345,205 A | 9/1994 | Kornrumpf |
| 5,347,428 A | 9/1994 | Carson et al. |
| 5,361,228 A | 11/1994 | Adachi et al. |
| 5,375,041 A | 12/1994 | McMahon |
| 5,377,077 A | 12/1994 | Burns |
| 5,386,341 A | 1/1995 | Olson et al. |
| 5,390,844 A | 2/1995 | Distefano et al. |
| 5,394,010 A | 2/1995 | Tazawa et al. |
| 5,394,300 A | 2/1995 | Yoshimura |
| 5,394,303 A | 2/1995 | Yamaji |
| 5,397,916 A | 3/1995 | Normington |
| 5,400,003 A | 3/1995 | Kledzik |
| 5,402,006 A | 3/1995 | O'Donley |
| 5,420,751 A | 5/1995 | Burns |
| 5,422,435 A | 6/1995 | Takiar et al. |
| 5,428,190 A | 6/1995 | Stopperan |
| 5,438,224 A | 8/1995 | Papageorge et al. |
| 5,446,620 A | 8/1995 | Burns et al. |
| 5,448,511 A | 9/1995 | Paurus et al. |
| 5,455,740 A | 10/1995 | Burns |
| 5,475,920 A | 12/1995 | Burns et al. |
| 5,477,082 A | 12/1995 | Buckley et al. |
| 5,484,959 A | 1/1996 | Burns |
| 5,491,612 A | 2/1996 | Nicewarner et al. |
| 5,499,160 A | 3/1996 | Burns |
| 5,502,333 A | 3/1996 | Bertin et al. |
| 5,514,907 A | 5/1996 | Moshayedi |
| 5,523,619 A | 6/1996 | McAllister et al. |
| 5,523,695 A | 6/1996 | Lin |
| 5,548,091 A | 8/1996 | DiStefano et al. |
| 5,552,631 A | 9/1996 | McCormick |
| 5,561,591 A | 10/1996 | Burns |
| 5,566,051 A | 10/1996 | Burns |
| 5,572,065 A | 11/1996 | Burns |
| 5,579,207 A | 11/1996 | Hayden et al. |
| 5,588,205 A | 12/1996 | Roane |
| 5,592,364 A | 1/1997 | Roane |
| 5,594,275 A | 1/1997 | Kwon et al. |
| 5,600,541 A | 2/1997 | Bone et al. |
| 5,612,570 A | 3/1997 | Eide et al. |
| 5,625,221 A | 4/1997 | Kim et al. |
| 5,631,807 A | 5/1997 | Griffin |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,657,537 A | 8/1997 | Saia et al. |
| 5,659,952 A | 8/1997 | Kovac et al. |
| 5,677,566 A | 10/1997 | King et al. |
| 5,677,569 A | 10/1997 | Choi et al. |
| 5,714,802 A | 2/1998 | Cloud et al. |
| 5,715,144 A | 2/1998 | Ameen et al. |
| 5,729,894 A | 3/1998 | Rostoker et al. |
| 5,744,862 A | 4/1998 | Ishii |
| 5,751,553 A | 5/1998 | Clayton |
| 5,754,409 A | 5/1998 | Smith |
| 5,764,497 A | 6/1998 | Mizumo |
| 5,776,797 A | 7/1998 | Nicewarner et al. |
| 5,778,522 A | 7/1998 | Burns |
| 5,778,552 A | 7/1998 | Burns |
| 5,783,464 A | 7/1998 | Burns |
| 5,789,815 A | 8/1998 | Tessier et al. |
| 5,801,437 A | 9/1998 | Burns |
| 5,801,439 A | 9/1998 | Fujisawa et al. |
| 5,804,870 A | 9/1998 | Burns |
| 5,805,422 A | 9/1998 | Otake et al. |
| 5,805,424 A | 9/1998 | Purinton |
| 5,811,879 A | 9/1998 | Akram |
| 5,821,614 A * | 10/1998 | Hashimoto et al. .......... 257/679 |

| Patent | Kind | Date | Inventor |
|---|---|---|---|
| 5,835,988 | A | 11/1998 | Ishii |
| 5,844,168 | A | 12/1998 | Schueller et al. |
| 5,861,666 | A | 1/1999 | Bellaar |
| 5,869,353 | A | 2/1999 | Levy et al. |
| 5,899,705 | A | 5/1999 | Akram |
| 5,917,242 | A | 6/1999 | Ball |
| 5,917,709 | A | 6/1999 | Johnson et al. |
| 5,925,934 | A | 7/1999 | Lim |
| 5,926,369 | A | 7/1999 | Ingraham et al. |
| 5,949,657 | A | 9/1999 | Karabatsos |
| 5,953,214 | A | 9/1999 | Dranchak et al. |
| 5,953,215 | A | 9/1999 | Karabatsos |
| 5,959,839 | A | 9/1999 | Gates |
| 5,963,427 | A | 10/1999 | Bolleson |
| 5,973,395 | A | 10/1999 | Suzuki et al. |
| 5,977,640 | A | 11/1999 | Bertin et al. |
| 5,995,370 | A | 11/1999 | Nakamori |
| 6,002,167 | A | 12/1999 | Hatano et al. |
| 6,002,589 | A | 12/1999 | Perino et al. |
| 6,013,948 | A | 1/2000 | Akram et al. |
| 6,014,316 | A | 1/2000 | Eide |
| 6,021,048 | A | 2/2000 | Smith |
| 6,025,642 | A | 2/2000 | Burns |
| 6,028,352 | A | 2/2000 | Eide |
| 6,028,358 | A | 2/2000 | Suzuki |
| 6,028,365 | A | 2/2000 | Akram et al. |
| 6,030,856 | A | 2/2000 | DiStefano et al. |
| 6,034,878 | A | 3/2000 | Osaka et al. |
| 6,040,624 | A | 3/2000 | Chambers et al. |
| 6,049,975 | A * | 4/2000 | Clayton ...................... 29/832 |
| 6,072,233 | A | 6/2000 | Corisis et al. |
| 6,080,264 | A | 6/2000 | Ball |
| 6,084,293 | A | 7/2000 | Ohuchi |
| 6,084,294 | A | 7/2000 | Tomita |
| 6,084,778 | A | 7/2000 | Malhi |
| 6,091,145 | A | 7/2000 | Clayton |
| 6,097,087 | A | 8/2000 | Farnworth et al. |
| 6,104,089 | A | 8/2000 | Akram |
| 6,121,676 | A | 9/2000 | Solberg |
| RE36,916 | E | 10/2000 | Moshayedi |
| 6,133,640 | A | 10/2000 | Leedy |
| 6,137,164 | A | 10/2000 | Yew et al. |
| 6,157,541 | A | 12/2000 | Hacke |
| 6,166,443 | A | 12/2000 | Inaba et al. |
| 6,172,418 | B1 | 1/2001 | Iwase |
| 6,172,874 | B1 | 1/2001 | Bartilson |
| 6,180,881 | B1 | 1/2001 | Isaak |
| 6,187,652 | B1 | 2/2001 | Chou et al. |
| 6,187,678 | B1 | 2/2001 | Gaynes et al. |
| 6,205,654 | B1 | 3/2001 | Burns |
| 6,208,010 | B1 | 3/2001 | Ikeda |
| 6,214,641 | B1 | 4/2001 | Akram |
| 6,222,737 | B1 | 4/2001 | Ross |
| 6,222,739 | B1 | 4/2001 | Bhakta et al. |
| 6,225,688 | B1 | 5/2001 | Kim et al. |
| 6,232,659 | B1 | 5/2001 | Clayton |
| 6,233,650 | B1 | 5/2001 | Johnson et al. |
| 6,234,820 | B1 | 5/2001 | Perino et al. |
| 6,239,496 | B1 | 5/2001 | Asada |
| 6,262,476 | B1 | 7/2001 | Vidal |
| 6,262,895 | B1 | 7/2001 | Forthun |
| 6,265,660 | B1 | 7/2001 | Tandy |
| 6,265,766 | B1 | 7/2001 | Moden |
| 6,266,252 | B1 | 7/2001 | Karabatsos |
| 6,268,649 | B1 | 7/2001 | Corisis et al. |
| 6,281,577 | B1 | 8/2001 | Oppermann et al. |
| 6,288,924 | B1 | 9/2001 | Sugano et al. |
| 6,294,406 | B1 | 9/2001 | Bertin et al. |
| 6,300,163 | B1 | 10/2001 | Akram |
| 6,300,679 | B1 | 10/2001 | Mukerji et al. |
| 6,303,981 | B1 | 10/2001 | Moden |
| 6,303,997 | B1 | 10/2001 | Lee |
| 6,310,392 | B1 | 10/2001 | Burns |
| 6,313,522 | B1 | 11/2001 | Akram et al. |
| 6,313,998 | B1 | 11/2001 | Kledzik |
| 6,316,825 | B1 | 11/2001 | Park et al. |
| 6,316,838 | B1 | 11/2001 | Ozawa et al. |
| 6,323,060 | B1 | 11/2001 | Isaak |
| 6,329,708 | B1 | 12/2001 | Komiyama |
| 6,329,713 | B1 | 12/2001 | Farquhar et al. |
| 6,336,262 | B1 | 1/2002 | Dalal et al. |
| 6,339,254 | B1 | 1/2002 | Venkateshwaran et al. |
| 6,351,029 | B1 | 2/2002 | Isaak |
| 6,360,433 | B1 | 3/2002 | Ross |
| 6,368,896 | B2 | 4/2002 | Farnworth et al. |
| 6,376,769 | B1 | 4/2002 | Chung |
| 6,388,333 | B1 | 5/2002 | Taniguchi et al. |
| 6,392,162 | B1 | 5/2002 | Karabatsos |
| 6,392,953 | B1 | 5/2002 | Yamada et al. |
| 6,404,043 | B1 | 6/2002 | Isaak |
| 6,404,049 | B1 | 6/2002 | Shibamoto et al. |
| 6,410,857 | B1 | 6/2002 | Gonya |
| 6,414,384 | B1 | 7/2002 | Lo et al. |
| 6,426,240 | B2 | 7/2002 | Isaak |
| 6,426,549 | B1 | 7/2002 | Isaak |
| 6,428,360 | B1 | 8/2002 | Hassanzadeh et al. |
| 6,433,418 | B1 | 8/2002 | Fujisawa et al. |
| 6,437,990 | B1 | 8/2002 | Degani et al. |
| 6,444,490 | B2 | 9/2002 | Bertin et al. |
| 6,444,921 | B1 | 9/2002 | Wang et al. |
| 6,446,158 | B1 | 9/2002 | Karabatsos |
| 6,449,159 | B1 | 9/2002 | Haba |
| 6,452,826 | B1 | 9/2002 | Kim et al. |
| 6,462,408 | B1 | 10/2002 | Wehrly, Jr. |
| 6,462,412 | B2 | 10/2002 | Kamei et al. |
| 6,462,421 | B1 | 10/2002 | Hsu et al. |
| 6,465,877 | B1 | 10/2002 | Farnworth et al. |
| 6,465,893 | B1 | 10/2002 | Khandros et al. |
| 6,472,735 | B2 | 10/2002 | Isaak |
| 6,473,308 | B2 | 10/2002 | Forthun |
| 6,486,544 | B1 | 11/2002 | Hashimoto |
| 6,489,178 | B2 | 12/2002 | Coyle et al. |
| 6,489,687 | B1 | 12/2002 | Hashimoto |
| 6,492,718 | B2 | 12/2002 | Ohmori |
| 6,504,104 | B2 | 1/2003 | Hacke et al. |
| 6,509,639 | B1 | 1/2003 | Lin |
| 6,514,793 | B2 | 2/2003 | Isaak |
| 6,514,794 | B2 | 2/2003 | Haba et al. |
| 6,521,530 | B2 | 2/2003 | Peters et al. |
| 6,522,018 | B1 | 2/2003 | Tay et al. |
| 6,522,022 | B2 | 2/2003 | Murayama |
| 6,525,413 | B1 | 2/2003 | Cloud et al. |
| 6,528,870 | B2 | 3/2003 | Fukatsu et al. |
| 6,531,337 | B1 | 3/2003 | Akram et al. |
| 6,531,338 | B2 | 3/2003 | Akram et al. |
| 6,532,162 | B2 | 3/2003 | Schoenborn |
| 6,542,373 | B1 * | 4/2003 | Oba ........................ 361/760 |
| 6,552,910 | B1 | 4/2003 | Moon et al. |
| 6,560,117 | B2 | 5/2003 | Moon |
| 6,563,217 | B2 | 5/2003 | Corisis et al. |
| 6,572,387 | B2 | 6/2003 | Burns et al. |
| 6,573,593 | B1 | 6/2003 | Syri et al. |
| 6,576,992 | B1 | 6/2003 | Cady et al. |
| 6,583,502 | B2 | 6/2003 | Lee et al. |
| 6,590,282 | B1 | 7/2003 | Wang et al. |
| 6,600,222 | B1 | 7/2003 | Levardo |
| 6,603,198 | B2 | 8/2003 | Akram et al. |
| 6,608,763 | B1 | 8/2003 | Burns et al. |
| 6,614,664 | B2 | 9/2003 | Lee |
| 6,620,651 | B2 | 9/2003 | He et al. |
| 6,627,984 | B2 | 9/2003 | Bruce et al. |
| 6,639,309 | B2 | 10/2003 | Wallace |
| 6,646,335 | B2 | 11/2003 | Emoto |
| 6,646,936 | B2 | 11/2003 | Hamamatsu |
| 6,650,588 | B2 | 11/2003 | Yamagata |
| 6,657,134 | B2 | 12/2003 | Spielberger et al. |

| | | |
|---|---|---|
| 6,660,561 B2 | 12/2003 | Forthun |
| 6,661,092 B2 | 12/2003 | Shibata et al. |
| 6,673,651 B2 | 1/2004 | Ohuchi et al. |
| 6,674,644 B2 | 1/2004 | Schulz |
| 6,677,670 B2 | 1/2004 | Kondo |
| 6,683,377 B1 | 1/2004 | Shim et al. |
| 6,686,656 B1 | 2/2004 | Koh et al. |
| 6,690,584 B2 | 2/2004 | Uzuka et al. |
| 6,699,730 B2 | 3/2004 | Kim et al. |
| 6,707,684 B1 | 3/2004 | Andric et al. |
| 6,710,437 B2 | 3/2004 | Takahashi et al. |
| 6,717,275 B2 * | 4/2004 | Matsuura et al. ............ 257/778 |
| 6,720,652 B2 | 4/2004 | Akram et al. |
| 6,721,226 B2 | 4/2004 | Woo et al. |
| 6,726,346 B2 | 4/2004 | Shoji |
| 6,737,742 B2 | 5/2004 | Sweterlitsch |
| 6,737,891 B2 | 5/2004 | Karabatsos |
| 6,740,981 B2 | 5/2004 | Hosomi |
| 6,746,894 B2 | 6/2004 | Fee et al. |
| 6,756,661 B2 | 6/2004 | Tsuneda et al. |
| 6,759,737 B2 | 7/2004 | Seo et al. |
| 6,760,220 B2 | 7/2004 | Canter et al. |
| 6,765,288 B2 | 7/2004 | Damberg |
| 6,768,660 B2 | 7/2004 | Kong et al. |
| 6,774,475 B2 | 8/2004 | Blackshear et al. |
| 6,777,794 B2 | 8/2004 | Nakajima |
| 6,781,240 B2 | 8/2004 | Choi et al. |
| 6,788,560 B2 | 9/2004 | Sugano et al. |
| 6,798,057 B2 | 9/2004 | Bolkin et al. |
| 6,812,567 B2 | 11/2004 | Kim et al. |
| 6,815,818 B2 | 11/2004 | Moore et al. |
| 6,826,066 B2 | 11/2004 | Kozaru |
| 6,833,984 B1 | 12/2004 | Belgacem |
| 6,838,761 B2 | 1/2005 | Karnezos |
| 6,839,266 B1 | 1/2005 | Garrett et al. |
| 6,841,868 B2 | 1/2005 | Akram et al. |
| 6,849,949 B1 | 2/2005 | Lyu et al. |
| 6,850,414 B2 | 2/2005 | Benisek et al. |
| 6,853,064 B2 | 2/2005 | Bolken et al. |
| 6,858,910 B2 | 2/2005 | Coyle et al. |
| 6,869,825 B2 | 3/2005 | Chiu |
| 6,873,039 B2 | 3/2005 | Beroz et al. |
| 6,876,074 B2 | 4/2005 | Kim |
| 6,878,571 B2 | 4/2005 | Isaak et al. |
| 6,884,653 B2 | 4/2005 | Larson |
| 6,893,897 B2 | 5/2005 | Sweterlitsch |
| 6,897,565 B2 | 5/2005 | Pflughaupt et al. |
| 6,906,416 B2 | 6/2005 | Karnezos |
| 6,908,792 B2 | 6/2005 | Bruce et al. |
| 6,910,268 B2 | 6/2005 | Miller |
| 6,913,949 B2 | 7/2005 | Pflughaupt et al. |
| 6,914,324 B2 | 7/2005 | Rapport et al. |
| 6,919,626 B2 | 7/2005 | Burns |
| 6,927,471 B2 | 8/2005 | Salmon |
| 6,940,158 B2 | 9/2005 | Haba et al. |
| 6,940,729 B2 | 9/2005 | Cady et al. |
| 6,943,454 B1 | 9/2005 | Gulachenski et al. |
| 6,956,883 B2 | 10/2005 | Komoto |
| 6,972,481 B2 | 12/2005 | Karnezos |
| 6,977,440 B2 | 12/2005 | Pflughaupt et al. |
| 6,978,538 B2 | 12/2005 | DiStefano et al. |
| 6,989,285 B2 | 1/2006 | Ball |
| 7,011,981 B2 | 3/2006 | Kim et al. |
| 7,023,701 B2 | 4/2006 | Stocken et al. |
| 7,053,485 B2 | 5/2006 | Bang et al. |
| 7,053,486 B2 | 5/2006 | Shizuno |
| 7,057,278 B2 | 6/2006 | Naka et al. |
| 7,061,088 B2 | 6/2006 | Karnezos |
| 7,061,121 B2 | 6/2006 | Haba |
| 7,061,122 B2 | 6/2006 | Kim et al. |
| 7,064,426 B2 | 6/2006 | Karnezos |
| 7,071,547 B2 | 7/2006 | Kang et al. |
| 7,078,793 B2 | 7/2006 | Ruckerbauer et al. |
| 7,102,221 B2 | 9/2006 | Miyamoto et al. |
| 7,109,576 B2 | 9/2006 | Bolken et al. |
| 7,115,982 B2 | 10/2006 | Moxham |
| 7,115,986 B2 | 10/2006 | Moon et al. |
| 7,129,571 B2 | 10/2006 | Kang |
| 7,149,095 B2 | 12/2006 | Warner et al. |
| 7,161,237 B2 | 1/2007 | Lee |
| 7,264,992 B2 * | 9/2007 | Hsueh et al. ................ 438/106 |
| 2001/0013423 A1 | 8/2001 | Dalal et al. |
| 2001/0040793 A1 | 11/2001 | Inaba |
| 2002/0006032 A1 | 1/2002 | Karabatsos |
| 2002/0094603 A1 | 7/2002 | Isaak |
| 2002/0196612 A1 | 12/2002 | Gall et al. |
| 2003/0064548 A1 | 4/2003 | Isaak |
| 2003/0090879 A1 | 5/2003 | Doblar et al. |
| 2003/0116835 A1 | 6/2003 | Miyamoto et al. |
| 2003/0159278 A1 | 8/2003 | Peddle |
| 2004/0075991 A1 | 4/2004 | Haba et al. |
| 2004/0115866 A1 | 6/2004 | Bang et al. |
| 2004/0150107 A1 | 8/2004 | Cha et al. |
| 2004/0217461 A1 | 11/2004 | Damberg |
| 2004/0217471 A1 | 11/2004 | Haba |
| 2004/0245617 A1 | 12/2004 | Damberg et al. |
| 2004/0267409 A1 | 12/2004 | De Lorenzo et al. |
| 2005/0018495 A1 | 1/2005 | Bhakta et al. |
| 2005/0035440 A1 | 2/2005 | Mohammed |
| 2005/0040508 A1 | 2/2005 | Lee |
| 2005/0108468 A1 | 5/2005 | Hazelzet et al. |
| 2005/0133897 A1 | 6/2005 | Baek et al. |
| 2007/0126125 A1 * | 6/2007 | Rapport et al. .............. 257/777 |
| 2007/0143544 A1 * | 6/2007 | Lin et al. .................... 711/115 |

* cited by examiner

MEMORY CARD AND METHOD FOR DEVISING

RELATED APPLICATIONS

This application is a continuation of U.S. application Ser. No. 11/434,964, filed May 16, 2006, which is a continuation-in-part of U.S. patent application Ser. No. 11/330,307, filed Jan. 11, 2006, now U.S. Pat. No. 7,508,058, dated Mar. 24, 2009, both of which are hereby incorporated by reference for all purposes.

TECHNICAL FIELD

This invention relates to high density memory cards that employ leaded package integrated circuits.

BACKGROUND

A variety of systems and techniques are known for stacking packaged integrated circuits. Some techniques are devised for stacking chip-scale packaged devices (CSPs) while other systems and methods are better directed to leaded packages such as those that exhibit a set of leads extending from at least one lateral side of a typically rectangular package.

Memory devices are packaged in both chip-scale (CSP) and leaded packages. However, techniques for stacking CSP devices are typically not optimum for stacking leaded devices. Although CSP devices are gaining market share, in many areas, integrated circuits continue to be packaged in high volumes in leaded packages. For example, the well-known flash memory integrated circuit is typically packaged in a leaded package with fine-pitched leads emergent from one or both sides of the package. A common package for flash memory is the thin small outline package commonly known as the TSOP typified by leads emergent from one or more (typically a pair of opposite sides) lateral sides of the package.

The on-going demand for miniaturized and modular data storage has spawned a variety of memory module configurations, and many such designs employ leaded flash memory devices. Consumer electronics such as digital cameras as portable computers employ a variety of memory modules and cards to allowed storage mobility and cross-platform flexibility. As with many developments in electronics, a variety of formats and configurations for storage have recently been developed such as Multi Media Card (MMC) and the Memory Stick from Sony. One of the more successful recent portable memory storage configurations is the "Secure Digital" or "SD" format for memory cards first developed by Matsushita, SanDisk and Toshiba in the late 1990's. The "secure" part of the name for this card comes the encryption capability typically incorporated into the cards to reduced music piracy concerns. This capability is seldom employed, however.

The circuitry employed in a typical memory card is often a flash memory die or flash circuit in a specialized package integrated into a plastic casing configured to comply with the relevant dimensional requirements. Use of flash memory die or specialized packaging fails, however, to leverage testing and reliability and cost advantages implicit in TSOP packaged flash memory resulting from testing and volume production of memory circuitry fabricated and packaged in that format. What is needed, therefore, is a memory card configured to employ TSOP packaged memory.

Although the art has many techniques for stacking leaded devices, a new system and method for stacking leaded package TSOP devices in a memory card format is a welcome development. Accordingly, the present application discloses improved systems and methods for electrically and thermally coupling adjacent integrated circuit devices in stacked modules configured as memory cards.

SUMMARY OF THE INVENTION

The present invention provides a system and method for employing leaded packaged memory devices in memory cards. Leaded packaged ICs are disposed on one or both sides of a flex circuitry structure to create an IC-populated structure. In a preferred embodiment, leads of constituent leaded IC packages are configured to allow the lower surface of the leaded IC packages to contact respective surfaces of the flex circuitry structure. Contacts for typical embodiments are supported by a rigid portion of the flex circuitry structure and the IC-populated structure is disposed in a casing to provide card structure for the module.

DETAILED DESCRIPTION

Figure 1:
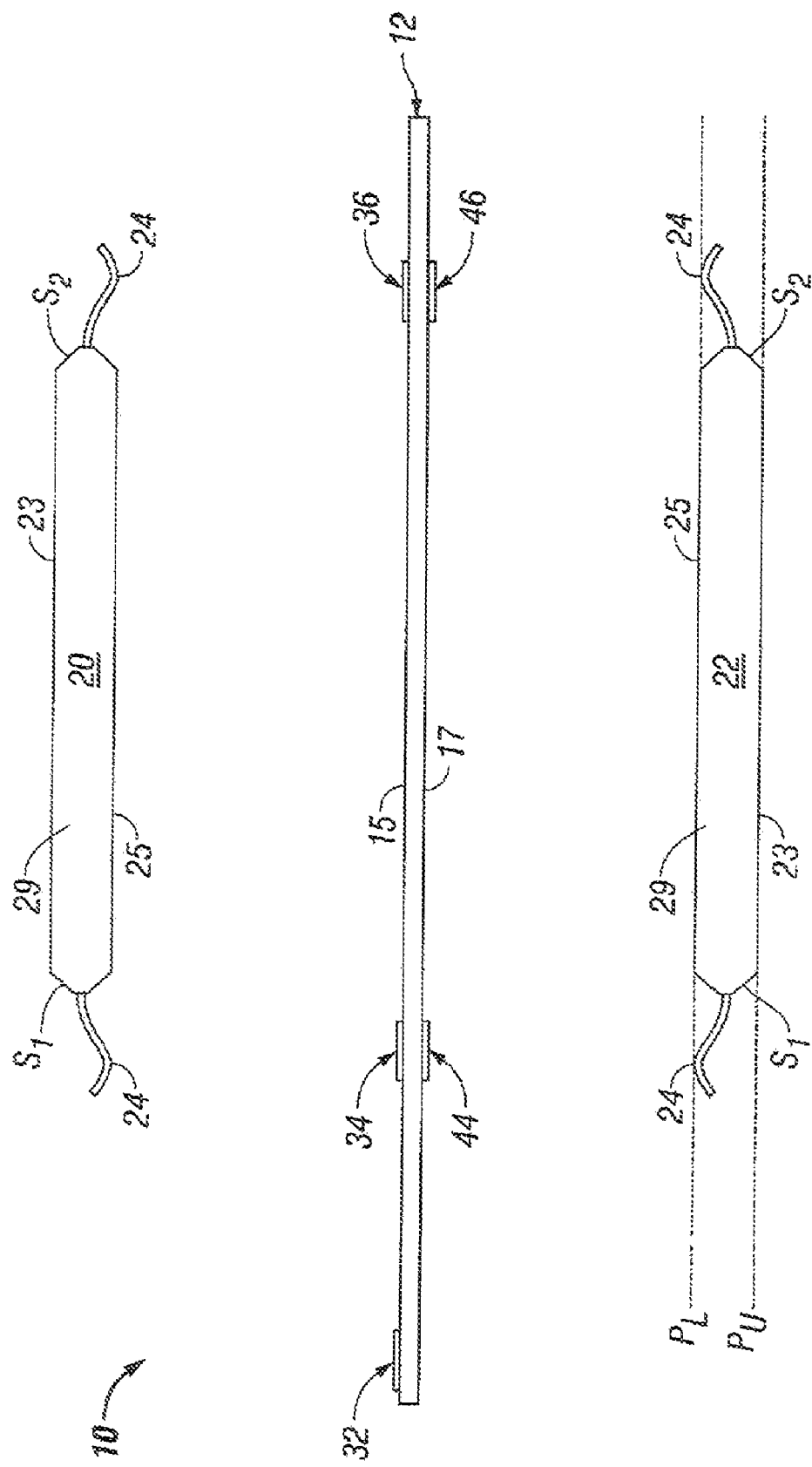
FIG. 1 is an exploded view of a stacked module devised in accordance with a preferred embodiment of the present invention.

FIG. 1 is an exploded view of an exemplar stacked module 10 devised in accordance with a preferred embodiment of the present invention. Exemplar module 10 is comprised of leaded ICs 20 and 22 each having upper and lower sides or surfaces 23 and 25, respectively, and lateral sides S1 and S2 which, as those of skill will recognize, may be in the character of edges or sides and need not be perpendicular in aspect to the upper and lower surfaces of 23 and 25. Leads 24 are emergent from sides S1 and S2. In a preferred embodiment, leads 24 are deflected to remain within the space defined by planes PL and PU defined by lower surfaces 25 and 23 respectively of the respective ICs to allow the lower surfaces 25 of each of the respective leaded packaged ICs to be in contact with the respective surfaces 15 and 17 of flex circuit 12 when the ICs are connected to the flex. In this disclosure, contact between the lower surface 25 of a leaded IC and the surfaces of flex circuit 12 includes not only direct contact between surface or side 25 flex but shall include those instances where intermediate materials such as adhesive is used between the respective leaded IC and flex.

The present invention may also be employed with circuitry other than or in addition to memory such as the flash memory depicted in a number of the present FIGS. Other exemplar types of circuitry that may be aggregated in stacks in accordance with embodiments of the invention include, just as non-limiting examples, DRAMs, FPGAs, and system stacks that include logic and memory as well as communications or graphics devices. It should be noted, therefore, that the depicted profile for ICs 20 and 22 is not a limitation and that upper and lower leaded ICs 20 and 22 respectively need not to TSOPs or TSOP-like and the packages employed may have more than one die or leads emergent from one, two, three or all sides of the respective package body. For example, a module 10 in accordance with embodiments of the present invention may employ leaded ICs 20 and 22 that have more than one die within each package and may exhibit leads emergent from only one side of the package. In such cases, adhesives will typically be employed between the IC and flex circuit. Further, a module 10 in accord with the present invention need not have two ICs as the invention may be employed to devise a stacked module 10 with two or more ICs as those of skill will understand after appreciating this disclosure. Further, techniques disclosed herein may be employed to stack a leaded IC in a leaded-CSP combination stack.

In the depicted preferred embodiment, flex circuit 12 (e.g., "flex", "flex circuitry", "flexible circuit" etc.) is disposed between leaded ICs 20 and 22 and exhibits a first side 15 having two pluralities of connective sites 34 and 36 adapted for connection to a leaded IC and, in this embodiment, another optional plurality of connective sites 32. Flex circuit 12 also exhibits a second side 17 having two pluralities of connective sites 44 and 46. Those of skill will recognize that flex circuit 12 may be comprised from traditional flexible circuitry or, in some of the alternative embodiments, what is sometimes called rigid-flex may be employed. Such rigid flex exhibits rigid areas and flexible areas to provide an interconnection function required of flex circuit 12 in the present invention.

Pluralities 34 and 36 and 44 and 46 of connective sites are adapted for connection to the leads of leaded packages IC 20 and IC 22, respectively, each of which has a plurality of peripheral sides, individual ones of which sides are identified as S1 and S2. Optional third plurality of connective sites 32 is adapted for connection of module 10 to an external circuit or environment.

Plural leads 24 are emergent from at least one of the plural sides of the ICs and typically, a plurality of leads 24 is emergent from one of the plural sides of each of the ICs 20 and 22 and a second plurality of leads 24 is emergent from another one of the plural sides of each of ICs 20 and 22. Leaded ICs 20 and 22 are connected to flex circuit 12 through the leads 24 of leaded ICs 20 and 22. As those of skill will recognize, many techniques exist for connecting the leads of leaded ICs 20 and 22 to the connective sites. Such techniques include, as a non-limiting example, use of solder or other conductive attachment. Other forms of bonding other than solder between the connecting sites and leads 24 may also be employed (such as brazing or welding for example) but soldering techniques are well understood and adapted for use in large scale manufacturing.

Figure 2:
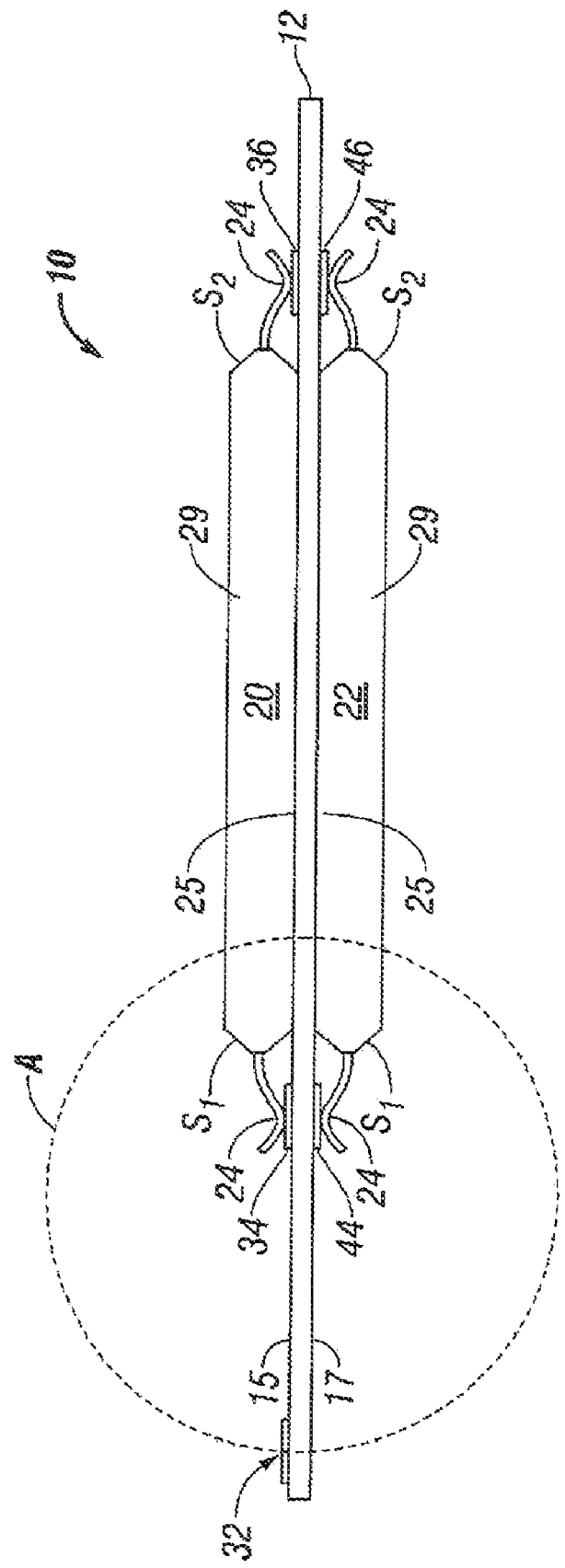
FIG. 2 is a side view of a stacked module devised in accordance with a preferred embodiment of the present invention.

FIG. 2 depicts a side perspective view of a stacked module 10 devised in accordance with a preferred embodiment of the present invention. As depicted, lower side 25 of each of leaded ICs 20 and 22 are adjacent to sides 15 and 17 respectively, of flex circuit 12. To realize the adjacent and, preferably, contact (touching) relationship between the lower side 25 of a selected leaded IC and the respective flex circuit side, leads 24 typically require modification or reconfiguration which is preferably performed before mounting of the leaded IC to flex circuit 12. Those of skill will note that a preferred method for reconfiguration of leads 24 comprises use of a jig to fix the position of body 29 of the respective leaded IC and, preferably, support the lead at the point of emergence from the body at sides S1 and S2 of leaded ICs 20 and 22 before deflection of the respective leads toward the upper plane PU to confine leads 24 to the space between planes PL and PU of the respective leaded IC as earlier shown in FIG. 1. This is because typically, leaded ICs such as TSOPs are configured with leads that extend beyond the lower plane PL. In order for the lower surface 25 of the respective leaded packaged ICs to contact (either directly or through an adhesive or thermal intermediary) the respective surfaces of the flex circuit, the leads 24 much be typically reconfigured.

Figure 3:
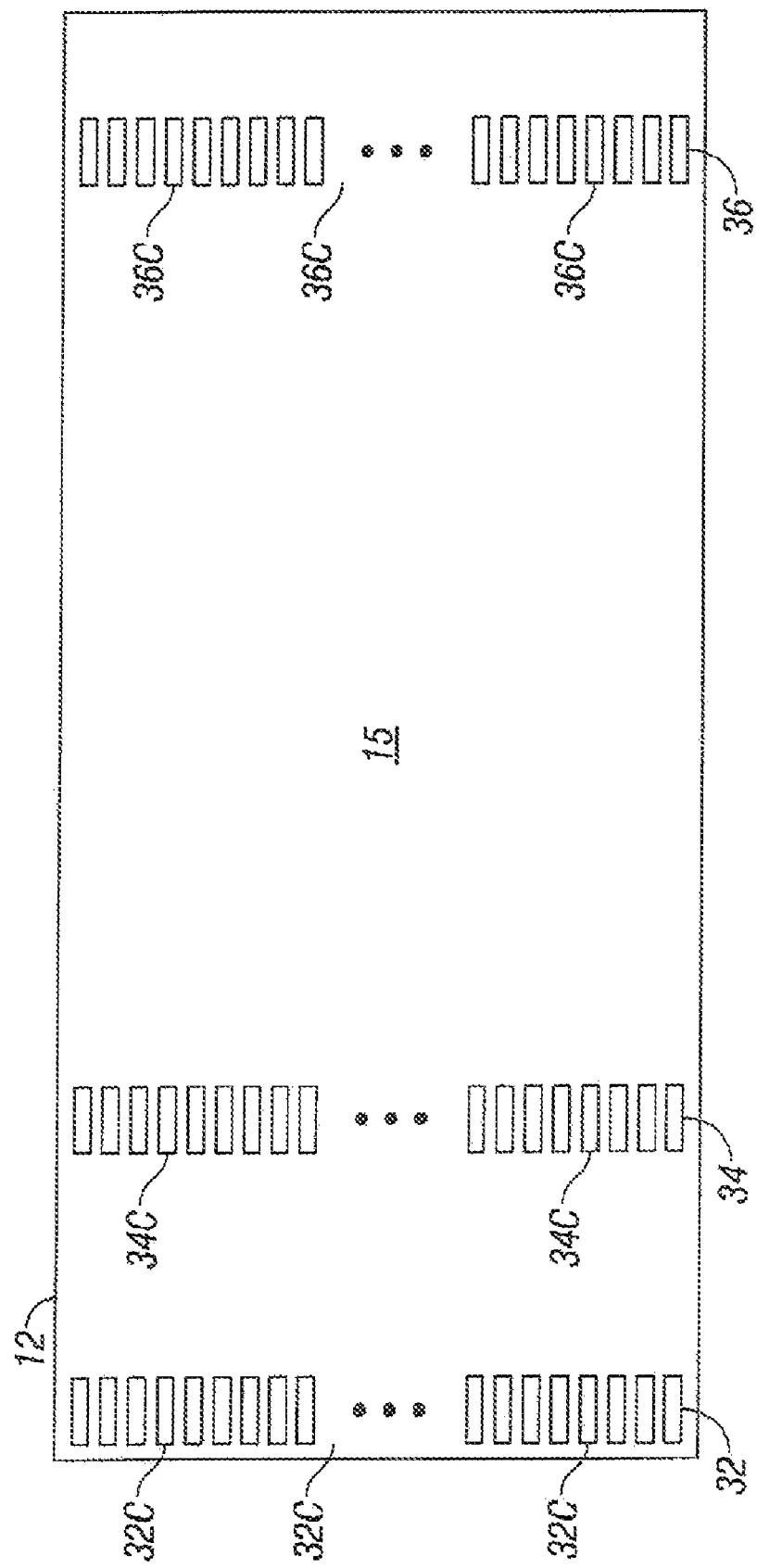
FIG. 3 is a plan view of one side of a flex circuit in accordance with an embodiment of the present invention.

FIG. 3 depicts a plan view of side 15 of the flex circuit. As depicted, side 15 exhibits three pluralities of connective sites, 32, 34, 36, each comprised of individual connective sites 32C, 34C, and 36C, respectively. First and second pluralities 34 and 36 are adapted for connection to leaded IC 20 through leads 24, with optional plurality of connective sites 32 being adapted for connecting module 10 to an external circuit or environment.

Figure 4:
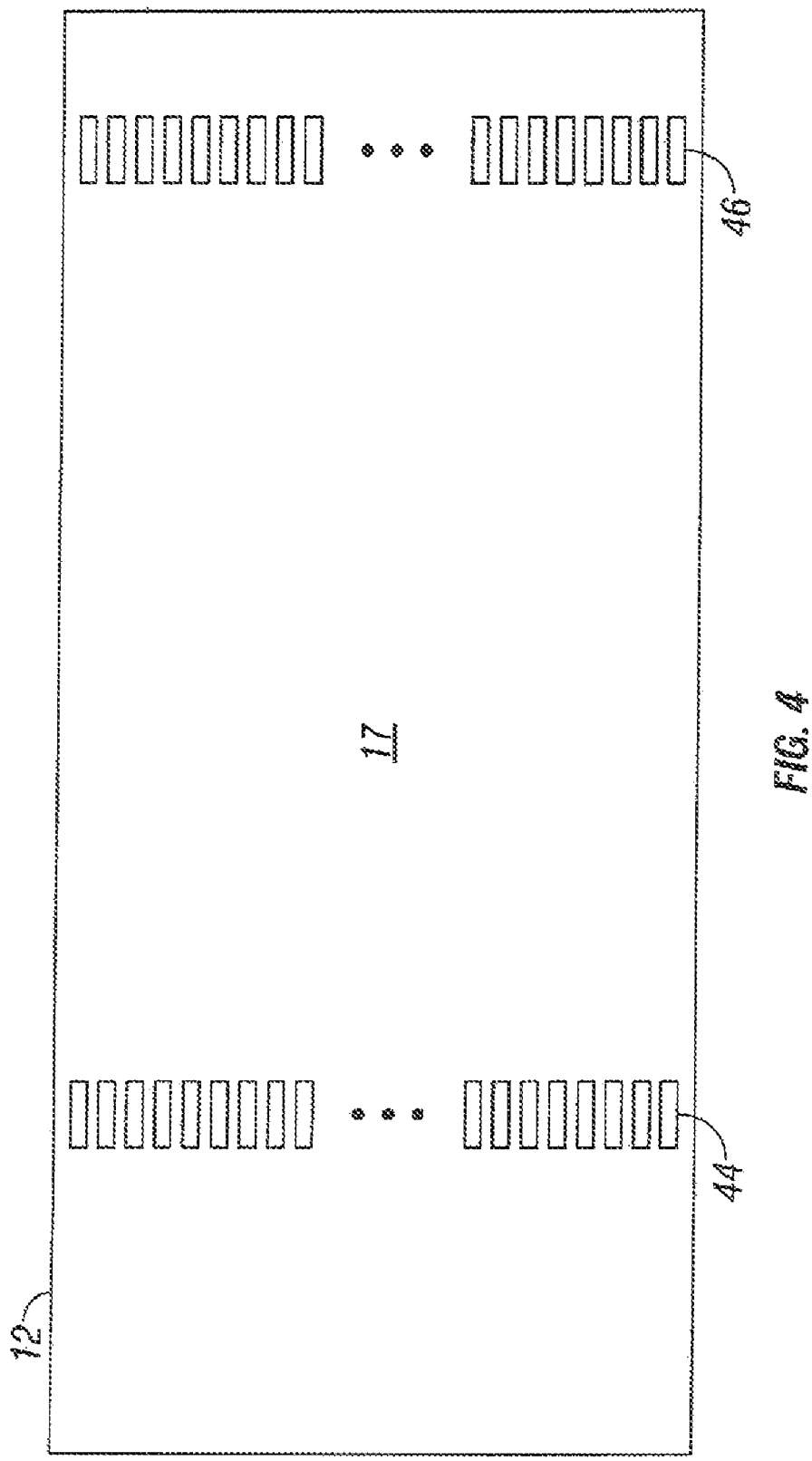
FIG. 4 is a plan view of another side of a flex circuit in accordance with an embodiment of the present invention.

FIG. 4 depicts a plan view of side 17 of flex circuit 12. As depicted, side 17 exhibits two pluralities of connective sites 44 and 46 respectively, each comprised of multiple connective sites 44C and 46C, respectively, these sites being adapted for connection to leaded IC 22 through leads 24.

Figure 5:
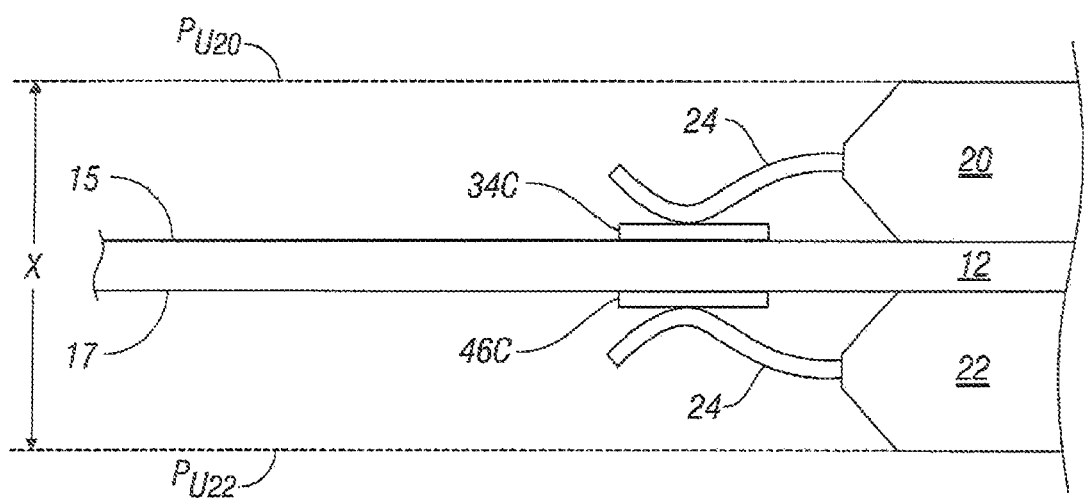
FIG. 5 depicts the area marked "A" in FIG. 2.

FIG. 5 depicts the area identified "A" in earlier FIG. 2. As depicted, the standard lead shape is modified or reconfigured to reduce the profile X of module 10 as lower surfaces 25 of leaded ICs 20 and 22 are adjacent to and, preferably, in contact with surfaces 15 and 17, respectively, of flex circuit 12. Profile X is the distance between respective upper planes PU20 and PU22. Leads 24 of leaded ICs 20 and 22 are preferably configured to allow leaded ICs 20 and 24 to be in either direct or indirect (through intermediary adhesive for example) contact with flex 12.

Leads 24 of leaded ICs 20 and 22 employed in an exemplar module 10 are shown in contact with connective sites 34C and 44C, for example, while lower surface 25 of the leaded ICs 20 and 22 are in contact with the respective sides 15 and 17 of the flex circuit 12.

Figure 6:
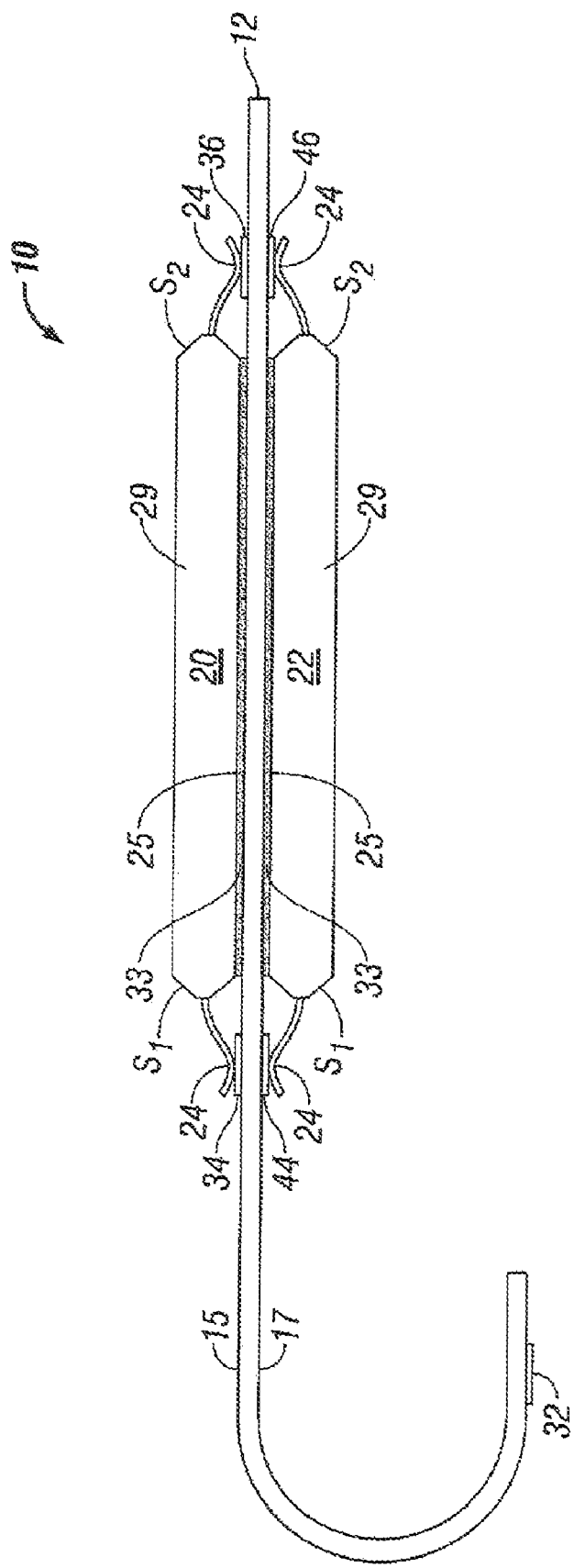
FIG. 6 is a side view of a stacked module in accordance with an alternative preferred embodiment of the present invention.

FIG. 6 depicts an exemplar module 10 having connective sites 32 for connection to an external circuit or environment. Those of skill will recognize that when a third plurality of connective sites such as the depicted reference 32 are employed, they may be disposed on either side 15 or 17 of flex circuit 12. In this depiction, adhesive 33 is shown between lower surfaces 25 and respective sides of flex circuit 12.

Figure 7:
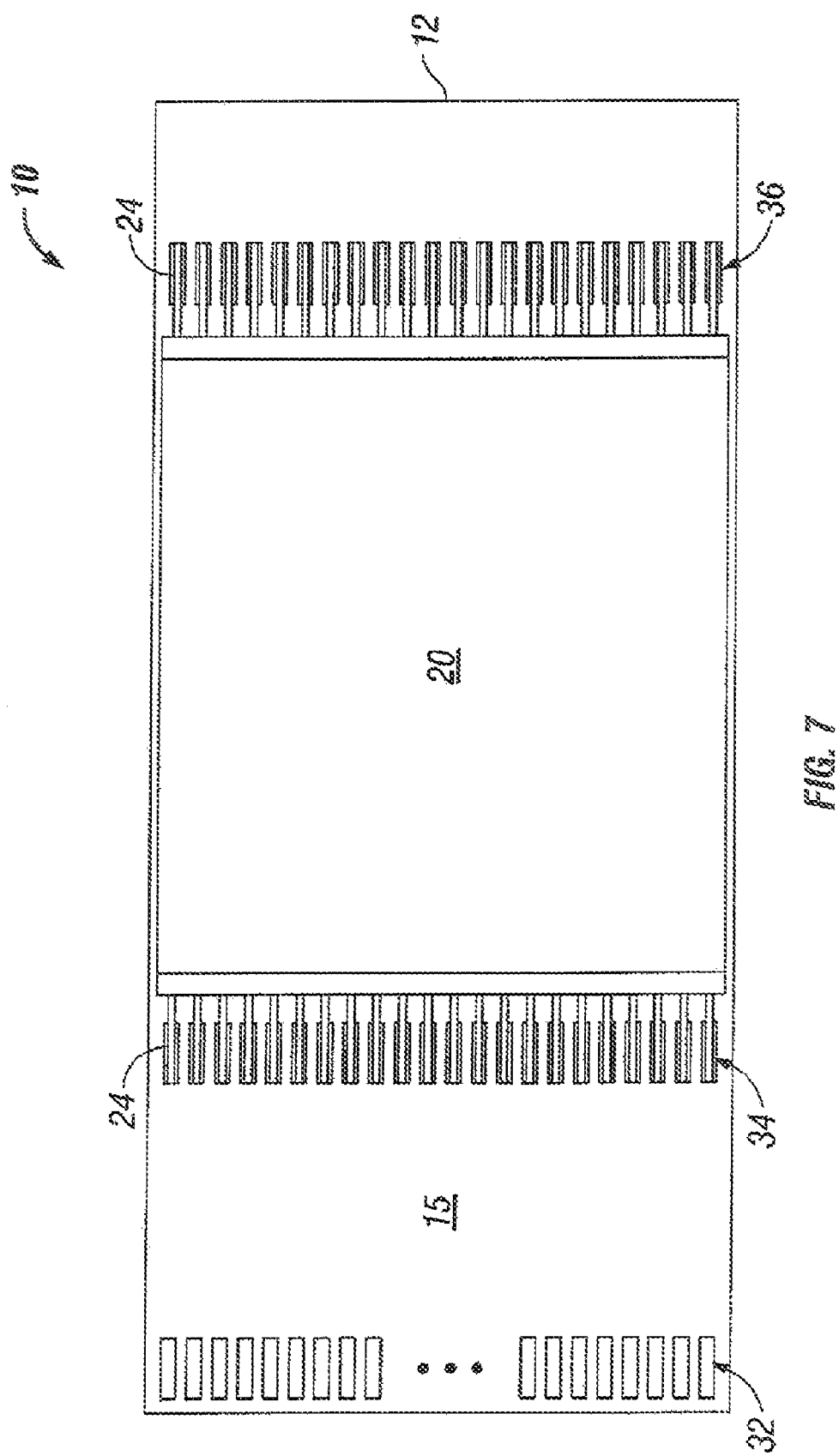
FIG. 7 is a plan view of a stacked module in accordance with an alternative preferred embodiment of the present invention.

FIG. 7 illustrates that, in devising a module in accordance with the present invention, some embodiments may be constructed where connective sites 32 take the form of edge connector pads for connection with an edge connector such as, for example, those typically found in computer applications for memory expansion.

Figure 8:
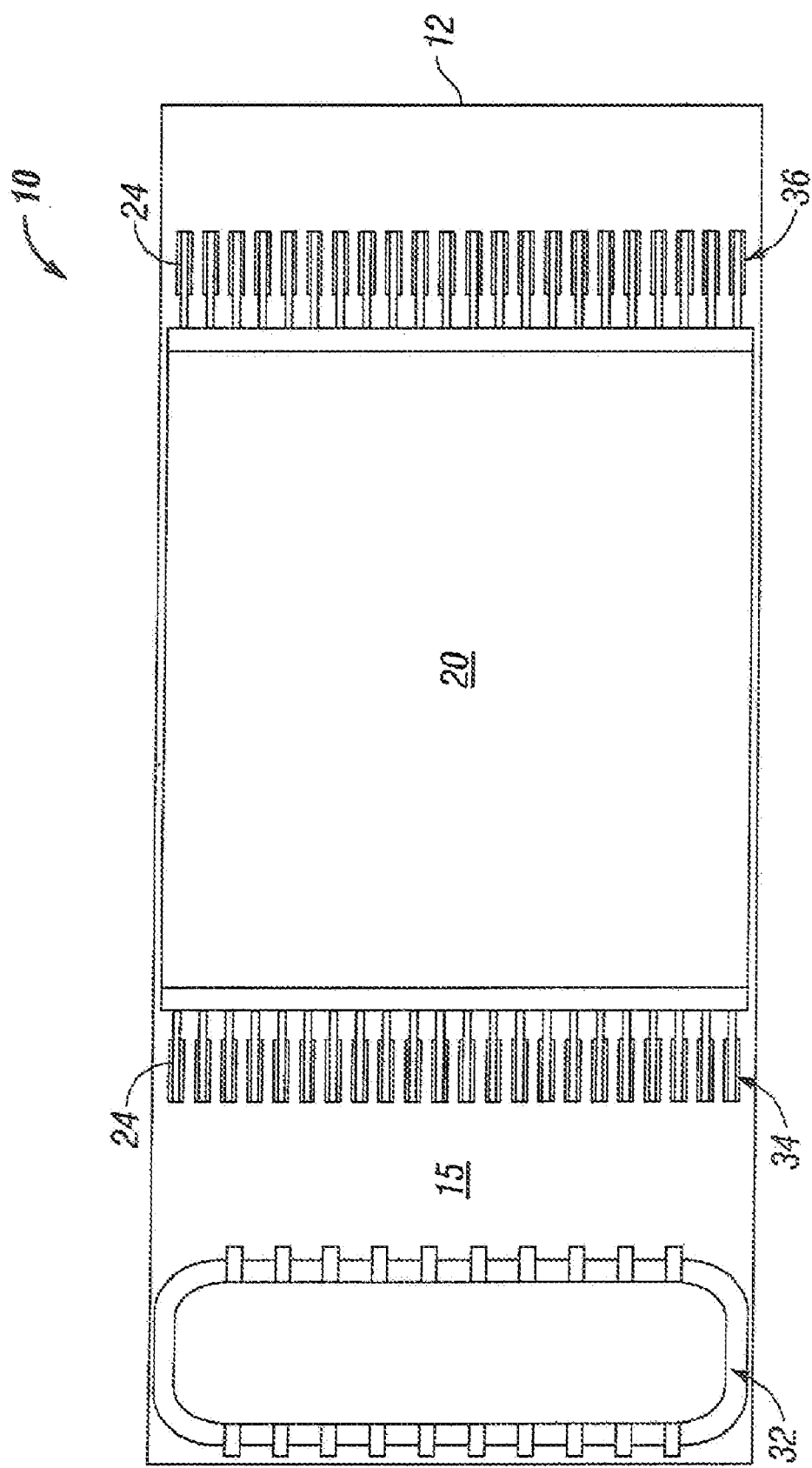
FIG. 8 is a plan view of a stacked module in accordance with another alternative preferred embodiment of the present invention.

FIG. 8 illustrates a plan view of an exemplar module 10 in accordance with an alternative preferred embodiment of the present invention. FIG. 8 employs a socket connector as the third plurality of connective sites 32 for connecting stacked module 10 to an external circuit or environment.

Figure 9:
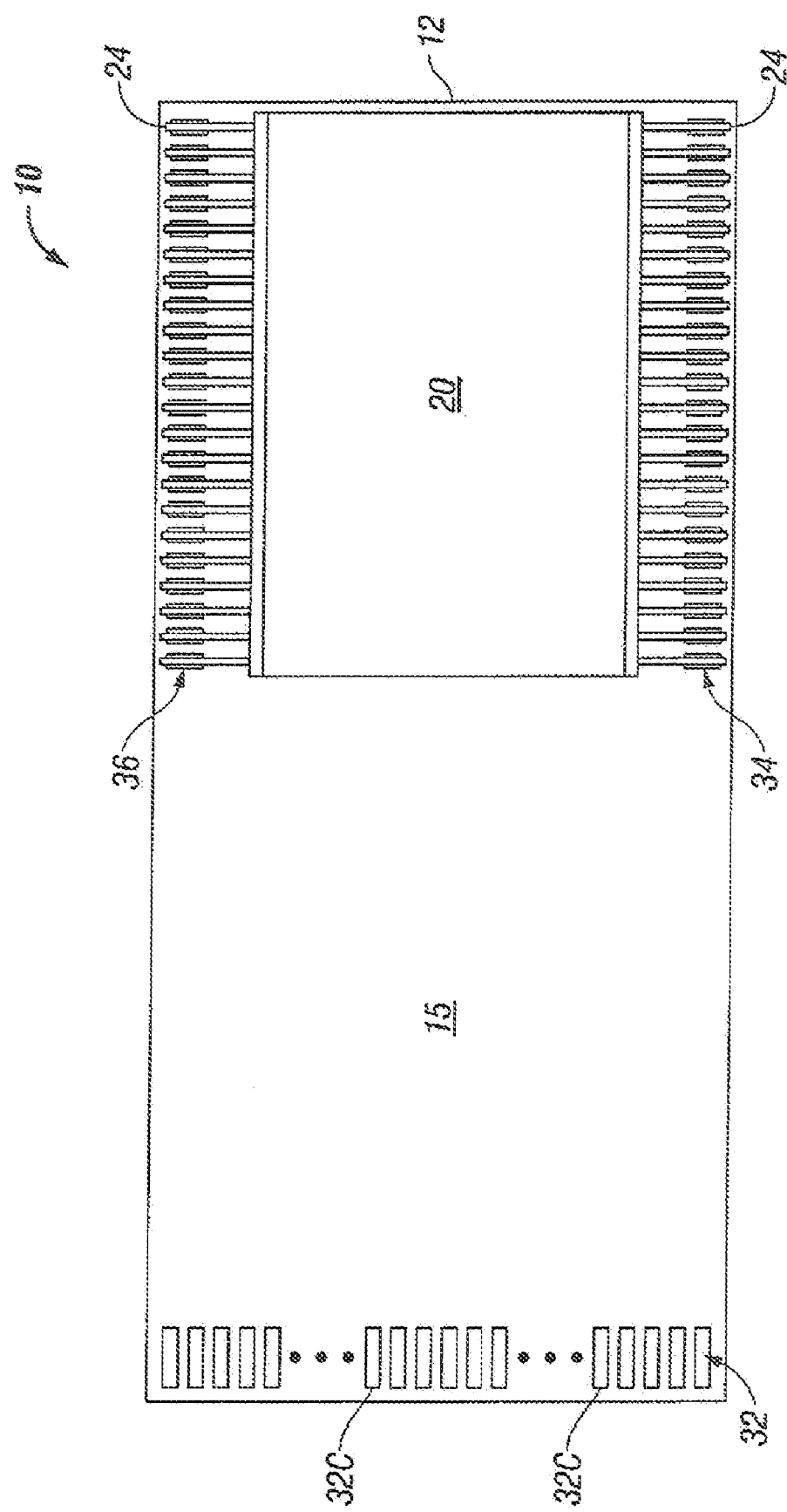
FIG. 9 is a plan view of a stacked module in accordance with another alternative preferred embodiment of the present invention.

FIG. 9 illustrates a module 10 in accordance with an alternative preferred embodiment of the present invention, showing alternative arrangements of the pluralities of connection sites on side 15 of the flex circuit. In the depiction of FIG. 9, the first and second pluralities of connective sites are oriented in a first direction while the third plurality of connective sites for connection of the circuit module to an application environment are oriented in a direction perpendicular to the orientation of the first and second pluralities of connective sites.

Figure 10:
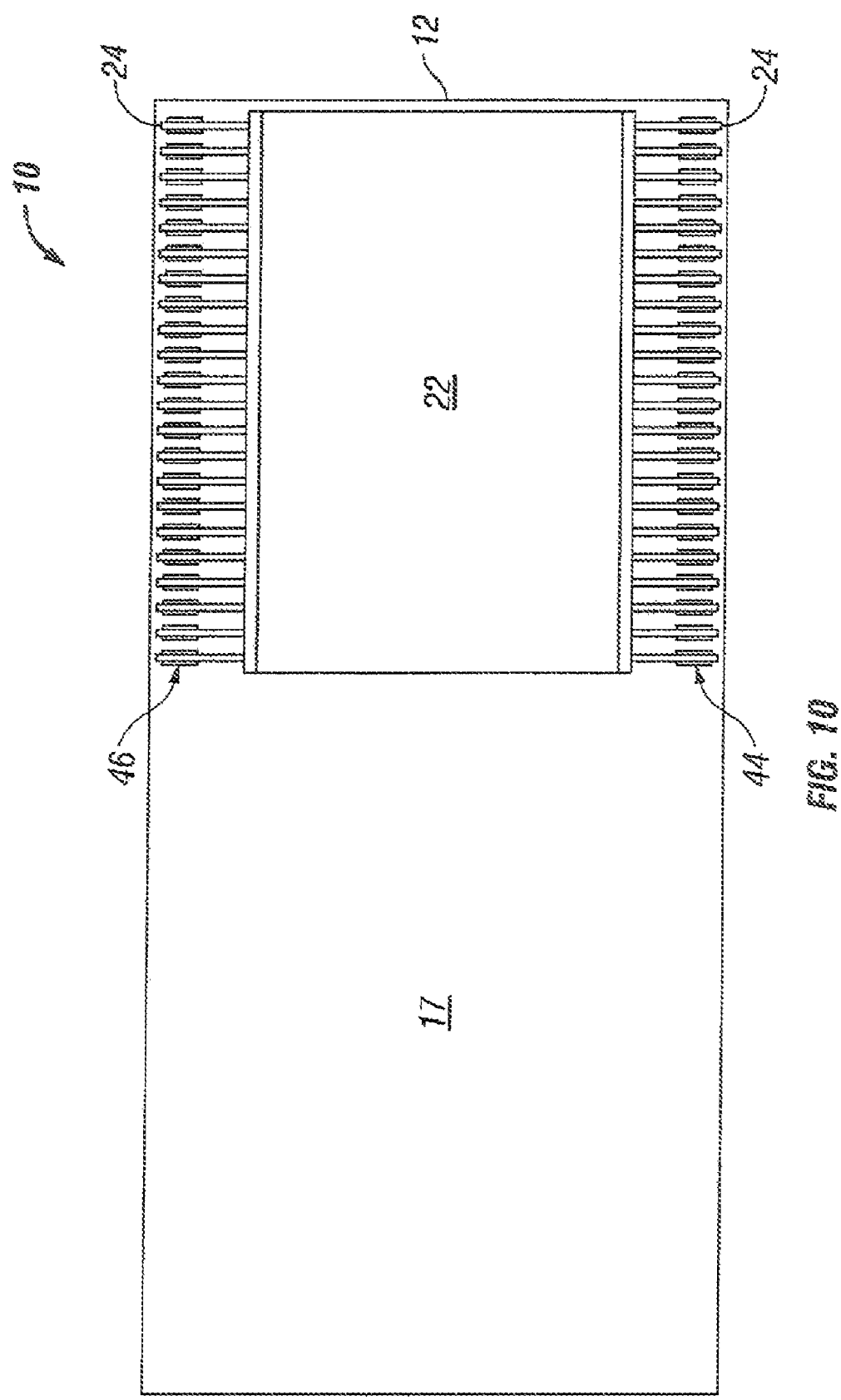
FIG. 10 is a plan view of another side of a stacked module in accordance with another alternative preferred embodiment of the present invention.

FIG. 10 is a plan view of another side of the stacked module depicted in FIG 9, sharing alternative arrangements of the pluralities of connective sites on side 17 of the flex circuit.

Figure 11:
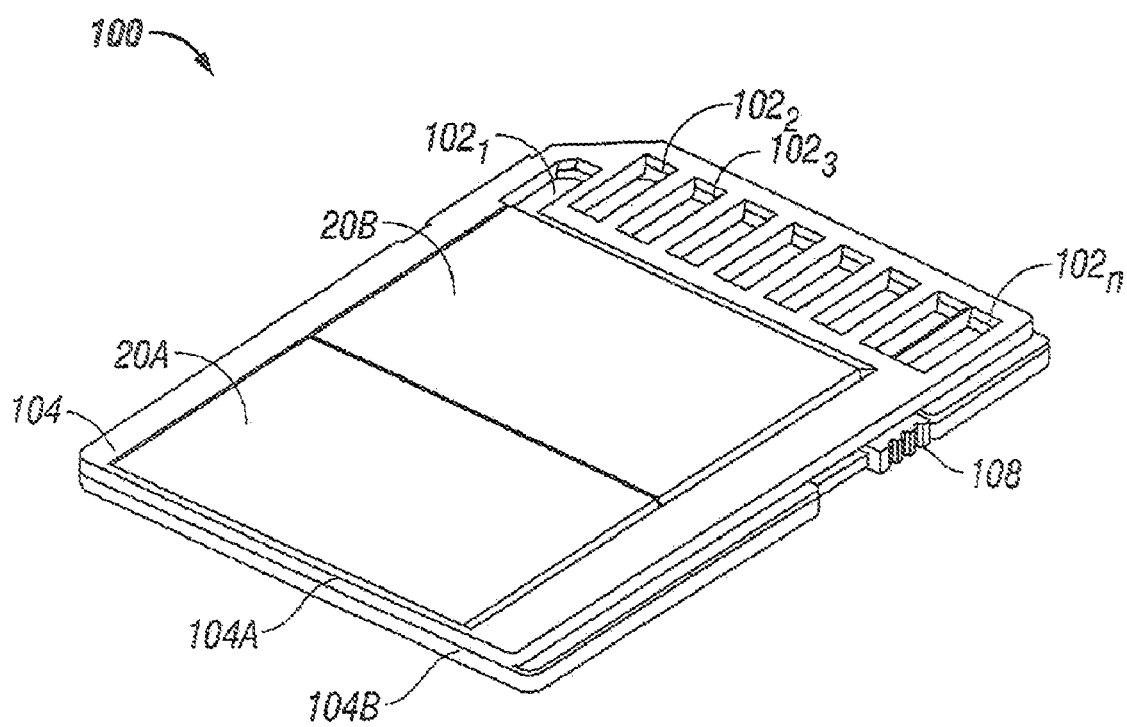
FIG. 11 is a perspective depiction of an exemplar memory card devised in accordance with a preferred embodiment of the present invention.

FIG. 11 is a perspective depiction of an exemplar memory card 100 devised in accordance with a preferred embodiment of the present invention. Although a variety of combinations of leaded devices may be aggregated according to the principles of the present invention to create a variety of memory cards, in this exemplar embodiment, memory card 100 is comprised from leaded ICs 20A and 20B visible in the depiction of FIG. 11 and another two leaded ICs 22A and 22B which are visible in later FIGS. In preferred SD memory card configurations, ICs 20A and 20B as well as 22A and 22B will typically be flash memory circuits in TSOP packages. As those of skill will recognize, card 100 can be dimensioned to comply with SD or other card or module requirements.

Memory card 100 exhibit card contacts $102_1$, $102_2$ * * * $102_n$ and may exhibit write lock 108 familiar to those of skill in the art. Plastic case 104 provides structure for card 100 and when the two typical parts of case 104 are assembled, case 104 will present obverse and reverse sides 104A and 104B, respectively. Because of typically tight tolerances in fitting ICs 20A, 20B, 22A and 22B with case 104, package molding flash often found along seams of leaded IC bodies are preferably removed before assembly of card 100.

Figure 12:
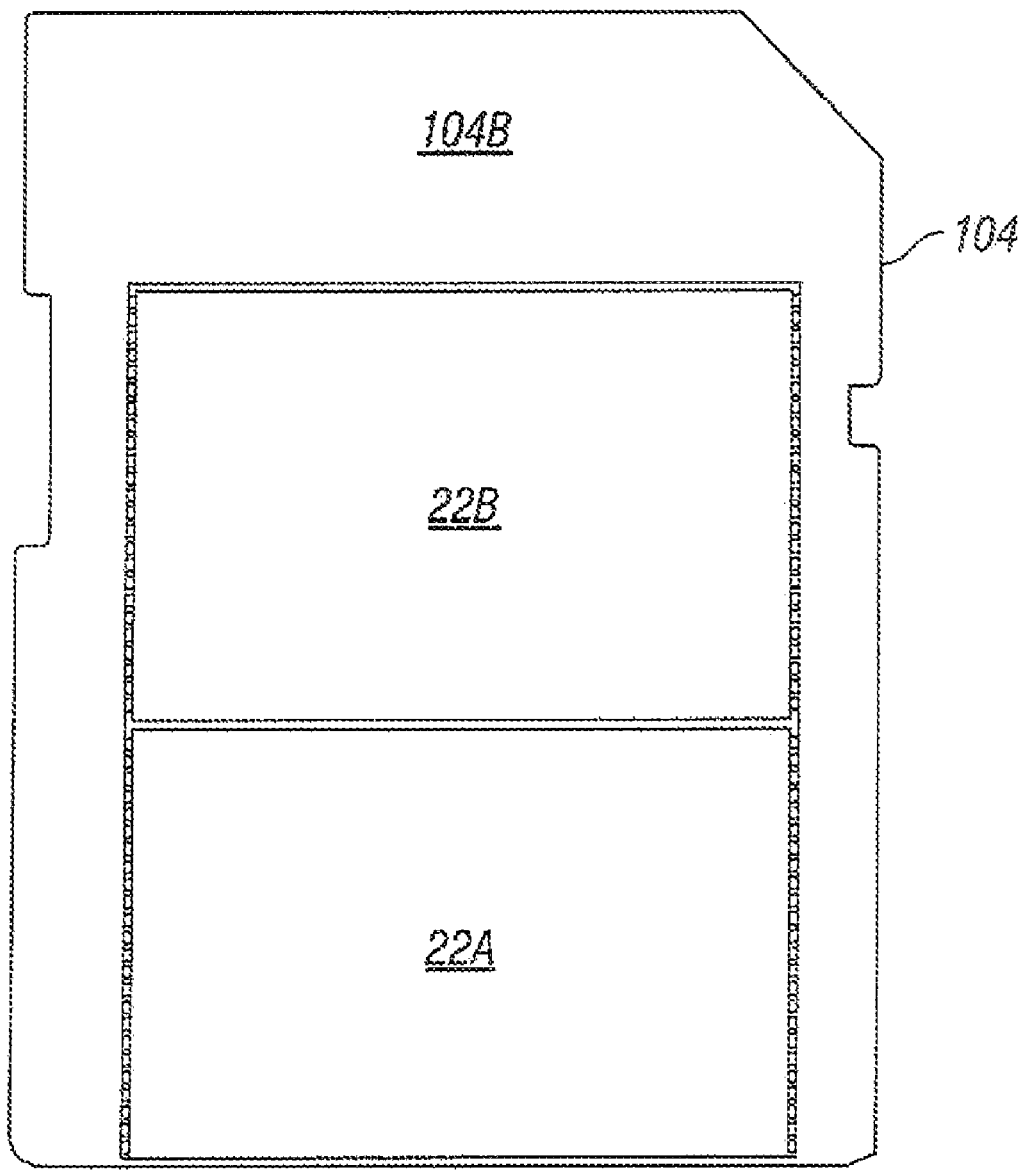
FIG. 12 depicts a reverse side of an exemplar memory card devised in accordance with a preferred embodiment of the present invention.

FIG. 12 depicts a reverse side of an exemplar memory card devised in accordance with a preferred embodiment of the present invention. Lower ICs 22A and 22B are shown as is case 104 and reverse surface 104B of case 104.

Figure 13:
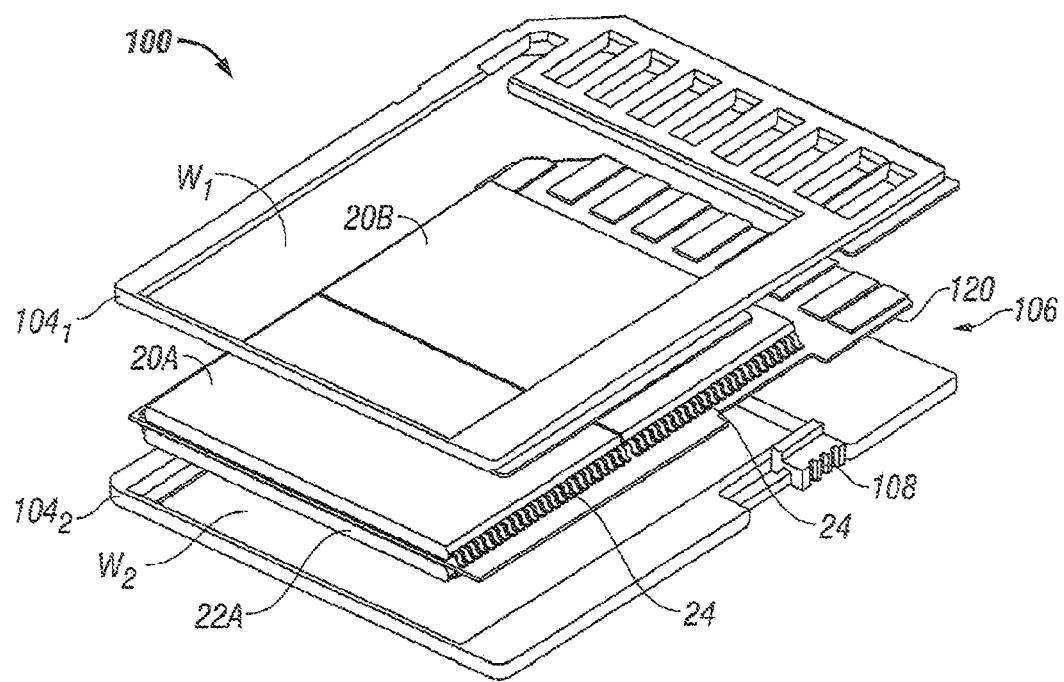
FIG. 13 is an exploded depiction of an exemplar memory card devised in accordance with a preferred embodiment of the present invention.

FIG. 13 is an exploded depiction of an exemplar memory card devised in accordance with a preferred embodiment of the present invention. As shown, exemplar casing 104 has two parts $104_1$ and $104_2$ that exhibit windows W1 and W2 to provide space for bodies 29 of the leaded ICs populated on flexible circuitry 120. Parts $104_1$ $104_2$ fit together to frame flexible circuitry structure 106 as shown. Flexible circuitry structure 106 is preferably an IC-populated flex circuit 120 which, as will be shown, preferably has areas that are rigid and areas that are flexible. Populated along a first side of flexible circuit 120 are ICs 20A and 20B, while ICs 22A and 22B are populated along a second side of flexible circuit 120. Each of the depicted leaded ICs exhibits a plurality of leads 24 emergent from at least one of the plural peripheral sides S1 or S1 of the respective bodies 29 of the respective leaded ICs as shown in greater detail in earlier FIGS. As those of skill will recognize, the number and orientation of leaded packaged ICs employed in card 100 can vary with the particular dimensional and electrical requirements imposed.

Figure 14:
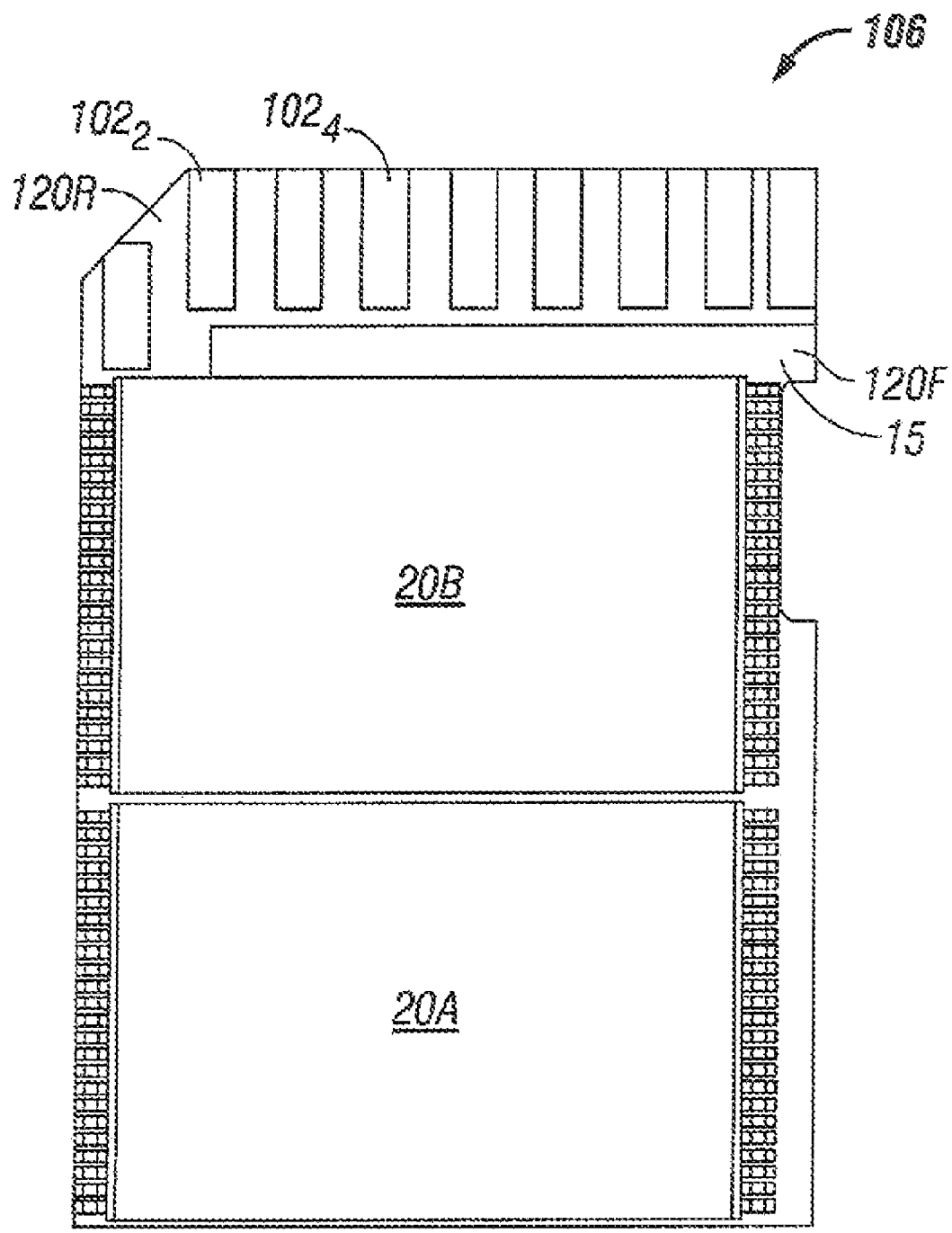
FIG. 14 depicts a flex circuitry structure populated with ICs packaged in leaded packages.

FIG. 14 depicts an obverse side of an exemplar flexible circuitry structure 106 populated with leaded ICs. As shown, flexible circuitry 120 is comprised of rigid portions 120R that provide support for card contacts $102_1$-$102_n$ and flexible portions 120F upon which are populated the respective leaded ICs 20A and 20B. Card contacts $102_1$-$102_n$ shown along the first major side 15 of flexible circuitry 120 may, as those of skill will recognize, be along one for both major sides of flexible circuitry 120. Further, those of skill will recognize that flexible circuitry 120 need not have both rigid and flexible portions, but that employment of such dual natured flex circuitry provides construction advantages in building card 100 that are of value in creating a card 100 that tolerates the rough usage requirements of consumer electronics, for example.

Figure 15:
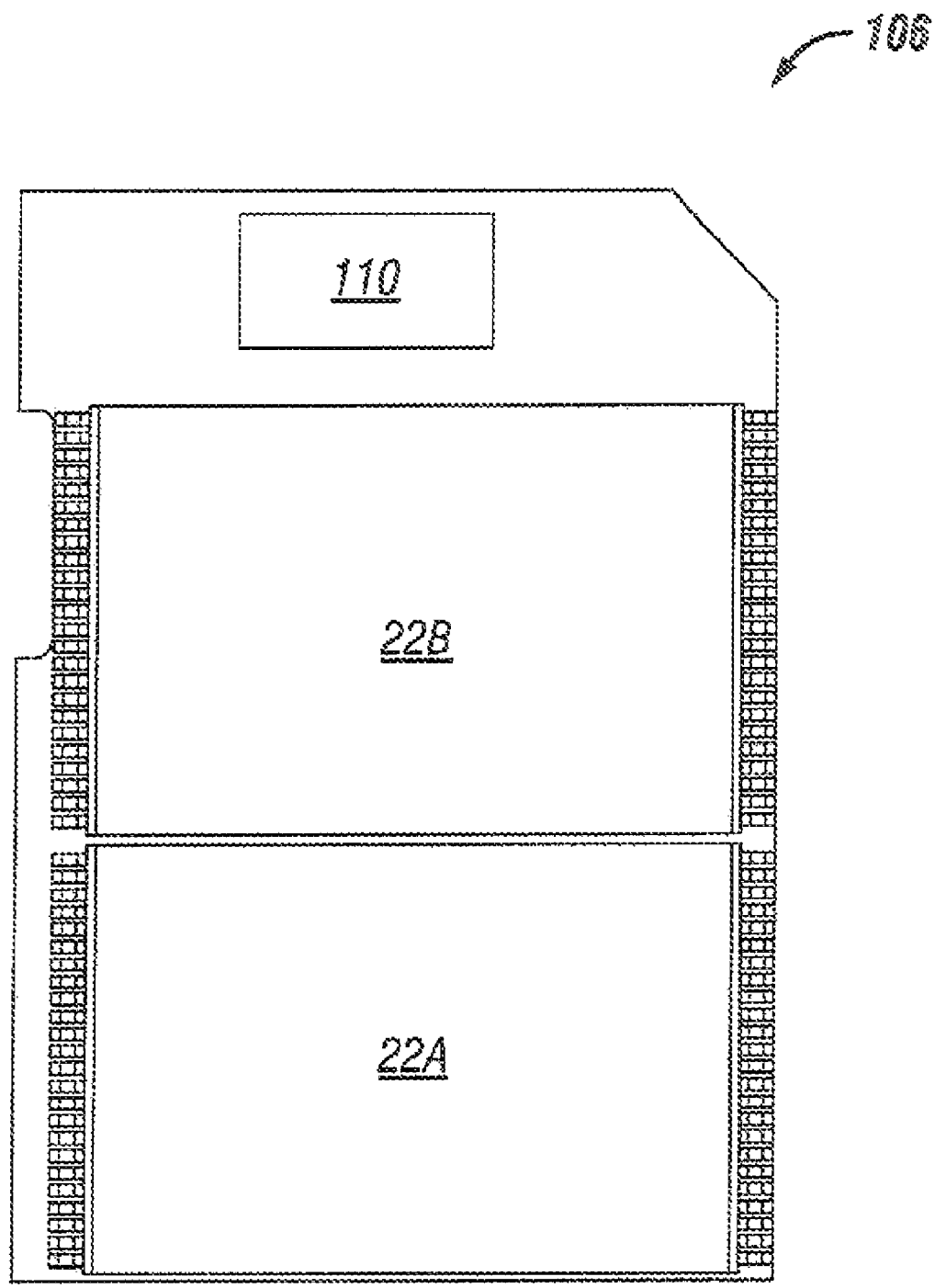
FIG. 15 is a depiction of a reserve side of a flex circuitry structure populated with ICs in leaded packages.
Figure 16:
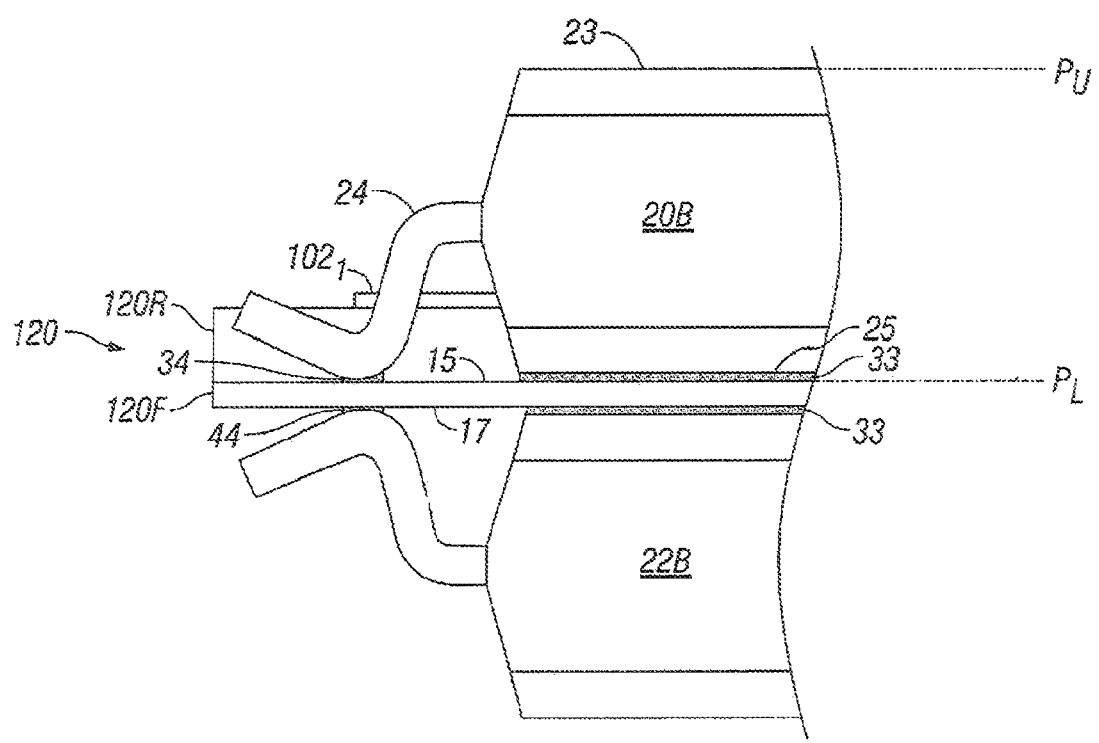
FIG. 16 is a cross-sectional depiction of a portion of an IC-populated flex circuitry structure of an exemplar memory card in accordance with a preferred embodiment of the present invention.

FIG. 15 is a depiction of a reserve side of a flexible circuitry structure 106 populated with ICs in leaded packages and shows ICs 22A and 22B populated along a second side of flexible portion 120F of flex circuitry 120. A controller 110 is shown disposed in a rigid portion 120R of flexible circuitry 120 of IC-populated flex circuitry structure 106. Although typically devised from multiple leaded ICs populated along a flexible circuit 120 comprised of both rigid and flexible portions 120R and 120F, flexible circuitry structure 106 may also employ for example a separate rigid material adhered to a portion of flexible flex circuitry as shown in FIG. 16 to create a rigid portion 120R preferred for support of card contacts $102_1$-$102_n$ which are located in an insertion area of card 100. Card contacts $102_1$-$102_n$ are configured to fit into a SD slot when card 100 is configured for SD use. As those in field will know, an SD card is typically configured or dimensioned to have the dimensions of 32 mm×24 mm×2.1 mm, but can be as thin as 1.4 mm.

FIG. 16 is a cross sectional depiction of a portion of a IC-populated flexible circuitry structure 106 of an exemplar memory card 100 in accordance with a preferred embodiment of the present invention. As earlier shown in FIGS. 1 and 5, leads 24 of the respective leaded ICs are deflected to remain within the space defined by planes PL and PU defined by lower and upper surfaces 25 and 23, respectively, to allow the lower surfaces 25 of each of the respective leaded packaged ICs to be in contact with the respective surfaces 15 and 17 of flexible circuitry 120 along which the ICs are disposed. The leaded ICs are typically connected to flexible circuitry 120 by connective sites such as the individual ones shown and identified in FIG. 16 with references 34 and 44 although a variety of techniques may be employed to populate flexible circuitry 120 with exemplar leaded ICs 20A, 20B, 22A and 22B. In this disclosure, contact between the lower surface 25 of a leaded IC and the respective major surface of flexible circuit 120 includes not only immediate and direct contact between lower surface 25 and flexible circuitry 120 but shall include those instances where intermediate materials such as adhesive 33 shown in FIG. 16 are between the lower surface 25 of the respective leaded IC and the respective major surface of the flexible circuitry.

It will be seen by those skilled in the art that many embodiments taking a variety of specific forms and reflecting changes, substitutions, and alternations can be made without departing from the spirit and scope of the invention. Therefore, the described embodiments illustrate but do not restrict the scope of the claims.

The invention claimed is:

1. A memory card comprising:
   an IC-populated flexible circuitry structure including:
      flexible circuitry having first and second major sides and card contacts along at least one of the first and second major sides;
      first, second, third and fourth leaded packaged ICs, each one of which leaded packaged ICs has an upper and a lower major surface and plural peripheral sides, a first plurality of leads emergent from at least a first one of the plural peripheral sides of each of the first, second, third, and fourth packaged ICs, the first major side of the flexible circuitry being populated with the first and second leaded package ICs and the second major side of the flexible circuitry being populated with the third and fourth leaded package ICs so that the lower surface of each of the first and second leaded packaged ICs contacts the first side of the flexible circuitry and the lower surface of each of the third and fourth leaded package ICs contacts the second side of the flexible circuitry; and
   a case having obverse and reverse sides and framing the first, second, third and fourth leaded packaged ICs, with the upper major surfaces of first and second leaded packaged ICs exposed along the obverse side of the case and the upper major surfaces of third and fourth leaded packaged ICs exposed along the reverse side of the case.

2. The memory card of claim 1 further comprising a controller.

3. The memory card of claim 1 in which the flexible circuitry has a rigid portion and a flexible portion.

4. The memory card of claim 1 in which the first, second, third and fourth leaded packaged ICs are flash memory circuits.

5. The memory card of claim 1 in which case frames the first, second, third and fourth leaded packaged ICs along each of the plural peripheral sides of the first, second, third and fourth leaded packaged ICs, respectively.

6. The memory card of claim 1 in which case frames the first, second, third and fourth leaded packaged ICs along less than all of the plural peripheral sides of the first, second, third and fourth leaded packaged ICs, respectively.

7. The memory card of claim 1 in which the leads of each of the first, second, third, and fourth leaded packaged ICs are confined in a space defined by first and second planes defined by the upper and lower major surfaces of each of the first, second, third, and fourth leaded packaged ICs, respectively.

8. The memory card of claim 1 in which an adhesive is disposed between the lower major surface of the first leaded packaged IC and the first major surface of the flexible circuitry.

9. The memory card of claim 1 in which an adhesive is disposed between the lower major surface of the third leaded packaged IC and the second major surface of the flexible circuitry.

10. A memory card comprising:
    an IC-populated flexible circuitry structure including:
       flexible circuitry having first and second major sides and card contacts along at least one of the first and second major sides;
       first and second leaded packaged ICs, each one of which leaded packaged ICs has an upper and a lower major surface and plural peripheral sides, a first plurality of leads emergent from at least a first one of the plural peripheral sides of each of the first and second packaged ICs, the first major side of the flexible circuitry being populated with the first leaded package IC and the second major side of the flexible circuitry being populated with the second leaded package IC so that the lower surface of the first leaded packaged IC contacts the first side of the flexible circuitry and the lower surface of the second leaded package IC contacts the second side of the flexible circuitry; and
    a case framing the IC-populated flexible circuitry structure and exposing the upper major surfaces of the first and second leaded packaged ICs.

11. The memory card of claim 10 in which the first and second leaded packaged ICs are flash memory circuits.

12. The memory card of claim 10 in which an adhesive is disposed between the lower major surface of the first leaded packaged IC and the first major surface of the flexible circuitry, and an adhesive is disposed between the lower major surface of the second leaded packaged IC and the second major surface of the flexible circuitry.

13. The memory card of claim 10 in which the case exposes at lease one peripheral side of the first leaded packaged IC or the second leaded packaged IC.

14. The memory card of claim 10 in which the leads of each of the first and second leaded packaged ICs are confined in a space defined by first and second planes defined by the upper and lower major surfaces of each of the first and second leaded packaged ICs, respectively.

15. The memory card of claim 10 in which the flexible circuitry has a rigid portion and a flexible portion.

16. A method for devising a memory card comprising the steps of:
    providing first and second leaded packaged integrated circuits each with upper and lower major surfaces and leads emergent from first and second peripheral sides of the respective packages;
    providing a flexible circuitry along the first surface of which are disposed first and second pluralities of connective sites and plural card contacts and along the second major surface of which are disposed first and second pluralities of connective sites; and
    reconfiguring the leads of the first and second leaded packaged integrated circuits so as to confine the leads to a space defined by first and second planes defined by the upper and lower major surfaces of the respective packages;
    attaching the leads emergent from the first peripheral side of the first leaded packaged integrated circuit to the first plurality of connective sites of the first major surface of the flex circuit and attaching the leads emergent from the second peripheral side of the first leaded packaged integrated circuit to the second plurality of connective sites of the first major surface of the flex circuit so as to realize contact between the lower major surface of the first leaded packaged integrated circuit and the first major surface of the flex circuit and connecting the second leaded packaged integrated circuit to the first and second pluralities of connective sites of the second major surface of the flex circuit; and
    enclosing the flexible circuitry and the first and second leaded packaged ICs in a case and exposing the upper major surface of the first leaded packaged IC.

17. The method of claim 16 in which an adhesive is disposed between the lower major surface of the first leaded packaged memory circuit and the first major surface of the flex circuit.

18. The method of claims 16 in which the first and second leaded packaged integrated circuits are flash memory circuits.

* * * * *